(12) United States Patent
Matsuo et al.

(10) Patent No.: US 7,782,648 B2
(45) Date of Patent: Aug. 24, 2010

(54) FUSE READING CIRCUIT

(75) Inventors: Yuichi Matsuo, Mizuho (JP); Takahisa Nakai, Ogaki (JP)

(73) Assignees: Sanyo Electric Co., Ltd. (JP); SANYO Semiconductor Co., Ltd. (JP)

( * ) Notice: Subject to any disclaimer, the term of this patent is extended or adjusted under 35 U.S.C. 154(b) by 227 days.

(21) Appl. No.: 11/863,693

(22) Filed: Sep. 28, 2007

(65) Prior Publication Data
US 2009/0003093 A1 Jan. 1, 2009

(30) Foreign Application Priority Data
Sep. 28, 2006 (JP) .............................. 2006-263957

(51) Int. Cl.
*G11C 17/00* (2006.01)
(52) U.S. Cl. ........................ 365/96; 365/219
(58) Field of Classification Search .................. 365/96, 365/219, 225.7
See application file for complete search history.

(56) References Cited
U.S. PATENT DOCUMENTS

| | | | | |
|---|---|---|---|---|
| 3,611,319 A | * | 10/1971 | Hyatt | ........................ 365/105 |
| 4,307,379 A | * | 12/1981 | Wyland | ...................... 340/14.3 |
| 5,646,896 A | * | 7/1997 | Pinkham | ...................... 365/200 |
| 6,373,771 B1 | * | 4/2002 | Fifield et al. | ............. 365/225.7 |
| 2006/0002212 A1 | | 1/2006 | Nakaya et al. | |
| 2006/0049856 A1 | | 3/2006 | Nakai et al. | |
| 2006/0171205 A1 | | 8/2006 | Bang et al. | |

FOREIGN PATENT DOCUMENTS

| | | |
|---|---|---|
| CN | 1641794 A | 7/2005 |
| CN | 1825486 A | 8/2006 |
| JP | 2006-72860 | 3/2006 |

OTHER PUBLICATIONS

First Office Action for Chinese Patent Application No. 200710148781.9 issued Jun. 5, 2009 with English translation.
Rejection Decision for Chinese Patent Application No. 200710148781.9 issued Jan. 22, 2010 with English translation.
English Translation of Rejection Decision for Chinese Patent Application No. 200710148781.9 issued Jan. 22, 2010.
English Translation of First Office Action for Chinese Patent Application No. 200710148781.9 issued Jun. 5, 2009.

* cited by examiner

*Primary Examiner*—Vu A Le
(74) *Attorney, Agent, or Firm*—Cantor Colburn LLP

(57) ABSTRACT

Correction data is written in fuse circuits of q bits. A reading circuit sequentially reads information of the fuse circuits through a selector and writes the information in a storage circuit. Therefore, read data is output from the storage circuit in parallel.

3 Claims, 6 Drawing Sheets

FUSE READING CIRCUIT

CROSS-REFERENCE TO RELATED APPLICATIONS

The entire disclosure of Japanese Patent Application No. 2006-263957 including specification, claims, drawings, and abstract is incorporated herein by reference.

BACKGROUND OF THE INVENTION

1. Field of the Invention

The present invention relates to a fuse reading circuit which reads data in a plurality of fuse circuits in which information is rewritten by trimming.

2. Description of the Related Art

A fuse circuit is known in the related art, which is used in a semiconductor integrated circuit (such as IC) for changing internal setting data in the semiconductor integrated circuit after the semiconductor integrated circuit is manufactured. More specifically, a fuse circuit is formed on a surface of an IC, and is trimmed using laser or a large current to cut the fuse and write information. In an IC, the trimming state of the fuse circuit can be read during startup of a system or the like, and the setting data can be changed based on a result of the reading process.

For example, JP 2006-72860 A discloses parallel connection of fuses to a resistor forming a part of a resistive voltage divider circuit, and cutting of the fuse with laser so that the resistance value of the divided voltage resistor circuit is adjusted.

Here, data of "0" or "1" can be written to the fuse circuit depending on whether or not the fuse circuit is cut, and, thus, in some cases, various digital data are set using the fuse circuit. For example, by providing two fuse circuits and a reading circuit, for each of the fuse circuits, which reads data by applying a voltage to one end of the fuse circuit and determining whether or not current flows through the fuse circuit, it is possible to read data of two bits.

When the number of bits of data which is set by the fuse circuit is small, the above-described structure is sufficient. However, when the number of bits is increased, not only the number of the fuse circuit is increased, but also the number of reading circuits is increased.

On the other hand, although a non-volatile memory is also widely in use for storage of a large amount of setting data, it is not efficient to prepare a non-volatile memory for storage of data having a size of few tens of bits.

SUMMARY OF THE INVENTION

According to one aspect of the present invention, there is provided a fuse reading circuit comprising a plurality of fuse circuits in which information is rewritten, a selector circuit which is connected to the plurality of fuse circuits, and a reading circuit which is connected to the selector circuit and which reads information of the plurality of fuse circuits, wherein the selector circuit sequentially selects the plurality of fuse circuits and the reading circuit reads the information of the plurality of fuse circuits.

According to another aspect of the present invention, it is preferable that, in the fuse reading circuit, the selector circuit sequentially selects one of the plurality of fuse circuits.

According to another aspect of the present invention, it is preferable that, in the fuse reading circuit, a number of the selector circuit which is connected to the plurality of fuse circuits is one and a number of the reading circuit which is connected to the selector circuit is one.

According to another aspect of the present invention, it is preferable that the fuse reading circuit further comprises a plurality of storage circuits which store information read by the reading circuit, wherein information sequentially read by the reading circuit is output from the plurality of storage circuits in parallel.

According to various aspects of the present invention, setting of a plurality of fuse circuits can be read with one reading circuit. Because of this, the size of the circuit can be reduced.

BRIEF DESCRIPTION OF THE DRAWINGS

A preferred embodiment of the present invention will be described in detail by reference to the drawings, wherein.

DESCRIPTION OF THE PREFERRED EMBODIMENTS

Preferred embodiments of the present invention (hereinafter referred to as "embodiments") will now be described with reference to the drawings.

[Structure of Preferred Embodiment]

Various information can be set in a fuse circuit. In the present embodiment, correction data for a D/A converter (digital-to-analog converter) in a source driver of a liquid crystal display panel is set.

The correction data which is set in the fuse is stored in a correction register during startup of a system. Because of this, the D/A converter is operated referring to the correction data in the correction register after the startup of the system.

Figure 5:
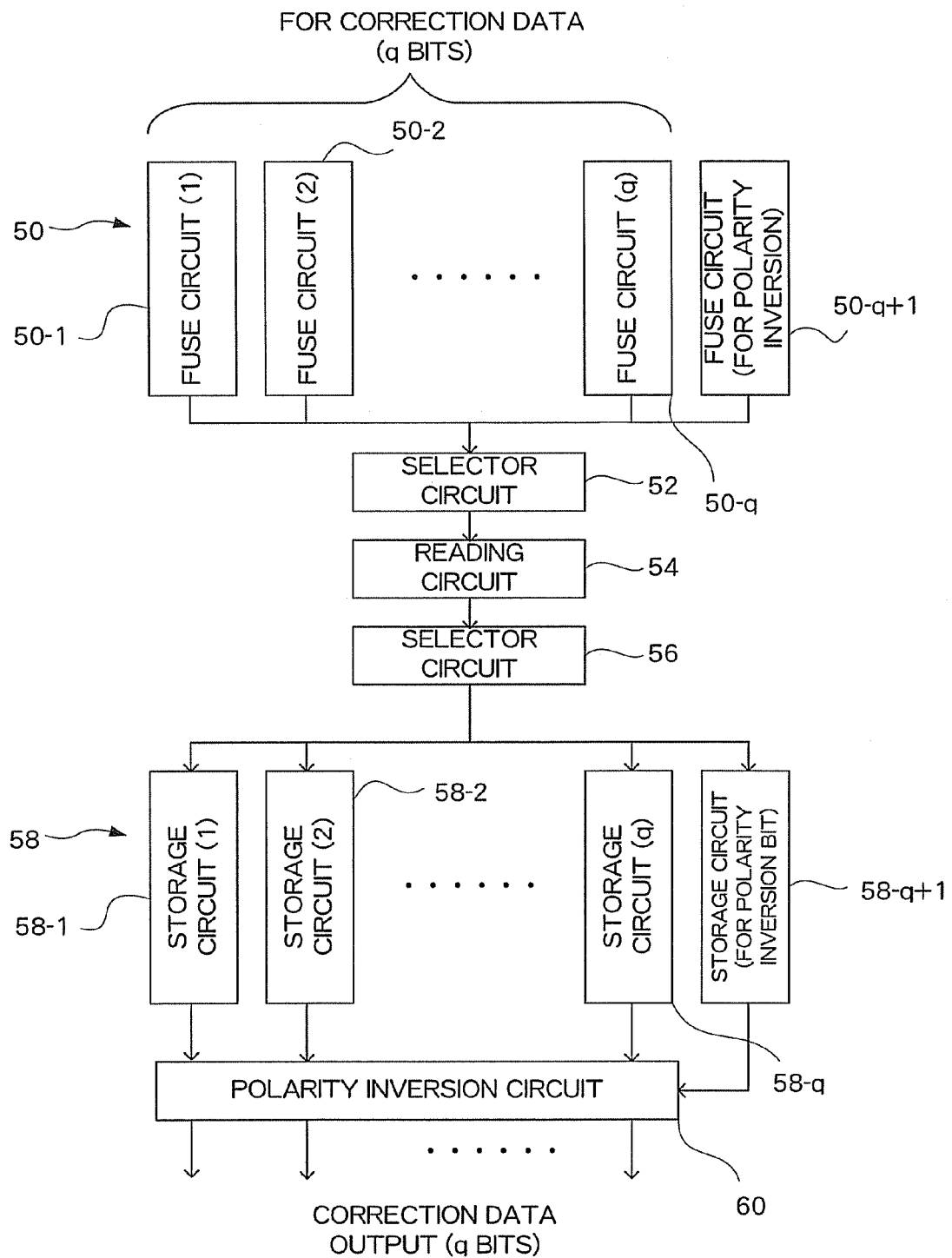
FIG. 5 is a diagram showing a structure of a correction using a fuse circuit.

FIG. 5 shows a structure of a correction data setting circuit using a fuse. The liquid crystal display panel is typically divided into a plurality of channels, and separate correction data are prepared for different channels. For example, when the size of the correction data is two bits and the liquid crystal display panel is divided into 13 channels, correction data of 26 bits is set by the fuse.

In the configuration shown in FIG. 5, while the size of the correction data is q bits, q+1 fuse circuits 50 (50-1~50-$q$+1) are provided. In the fuse circuit 50, data of 0 or 1 is set depending on whether or not the fuse is cut by laser or the like. Among the fuse circuits 50, the fuse circuit 50-$q$+1 is a bit for polarity inversion. The polarity inversion bit determines whether or not contents of the fuse circuits of q bits 50-1~50-$q$ are to be inverted.

A reading circuit 54 is connected to the fuse circuits 50-1~50-$q$+1 through a selector circuit 52. Because the reading circuit 54 reads the data of the fuse circuit 50 selected by the selector circuit 52, the reading of the fuse circuit 50 is a time division reading.

To the reading circuit 54, q+1 storage circuits 58-1~58-$q$+1 are connected through a selector circuit 56. Therefore, the read data from the fuse circuits $50\text{-}1\sim 50\text{-}q+1$ which are read by the reading circuit 54 are stored in the corresponding storage circuits $58\text{-}1\sim 58\text{-}q+1$.

An output of the storage circuit 58 is input to a polarity inversion circuit 60. The polarity inversion circuit 60 outputs the read data from the fuse circuits of q bits $50\text{-}1\sim 50\text{-}q$ without inversion or with inversion depending on the content of the polarity inversion bit. The polarity inversion circuit 60 may have a structure, for example, in which q exclusive OR circuits (EX-OR) are provided, and one of the outputs from the storage circuits of q bits $58\text{-}1\sim 58\text{-}q$ and the polarity inversion bit are input to each exclusive OR circuit. With this structure, the polarity inversion circuit 60 determines, based on the state of the polarity inversion bit, whether the read data of the fuse circuits of q bits $50\text{-}1\sim 50\text{-}q$ are output with inversion or without inversion.

The outputs of the polarity inversion circuits 60 are output as the correction data of q bits.

Figure 6:
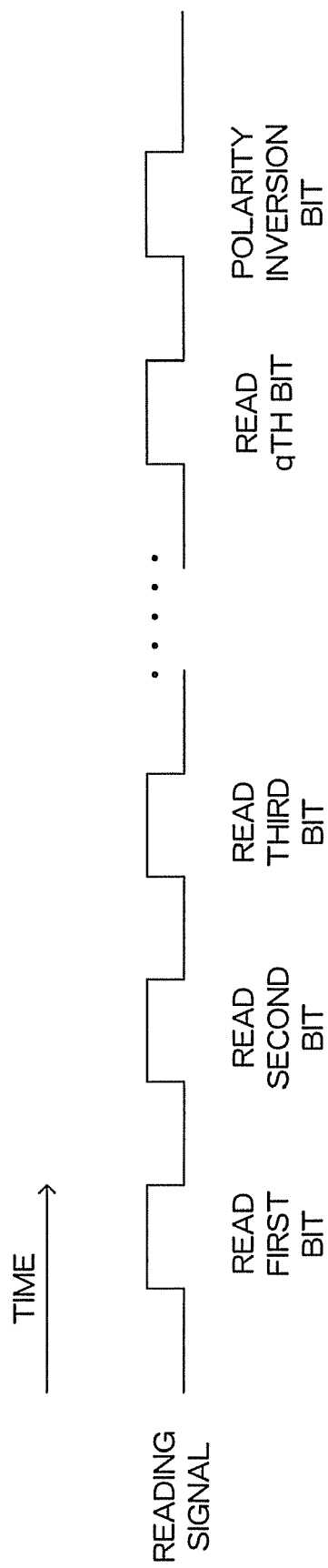
FIG. 6 is a diagram explaining reading of a fuse circuit.

FIG. 6 shows a reading timing at the reading circuit 54. The selectors 52 and 56 are sequentially switched, and data of q+1 bits read from the fuse circuits 50 in a time divisional manner are stored in the storage circuits 58.

Next, correction data will be described. As an example, the non-cut state of the fuse may represent "1" and the cut state of the fuse may represent "0", and the number of bits of the correction data may be 20 bits. The following three example cases fill be described.

(Case 1)

When correction data is "11111111110011110011", the number of 1's is 16, the number of 0's is 4, and the polarity inversion bit is not cut. In this data, the number of bits to be cut is 4.

(Case 2)

When correction data is "00010110000011101000", the number of 1's is 7, the number of 0's is 13, and the polarity inversion bit is cut. In this case, the number of bits to be cut is 8. If there is no polarity inversion bit, the number of bits to be cut would be 13.

(Case 3)

When correction data is "00000000000000000000", the number of 1's is 0, the number of 0's is 20, and the polarity inversion bit is cut. In this case, the number of bits to be cut is 1. If there is no polarity inversion bit, the number of bits to be cut would be 20.

As described, according to the present embodiment, q+1 fuse circuits are prepared for setting of correction data of q bits, but the cutting operation of the fuse can be significantly reduced with the content of the correction data, enabling an efficient operation.

[Structure of D/A Converter]

Figure 1:
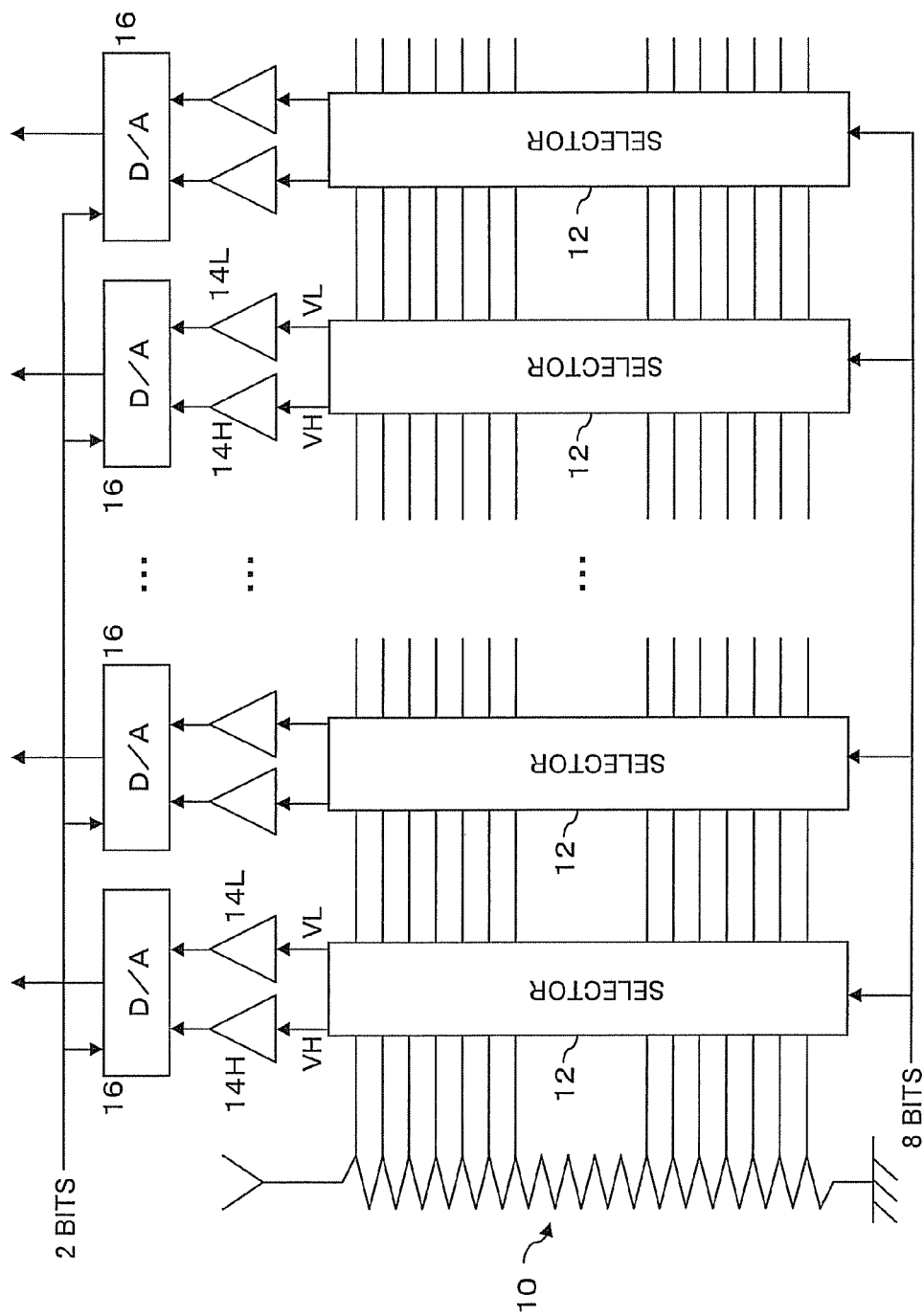
FIG. 1 is a diagram showing a structure of a preferred embodiment of the present invention.

FIG. 1 is a diagram schematically showing a structure of a D/A converter which uses the correction data as described above. The D/A converter converts a digital signal of 10 bits into an analog signal, and comprises inputs and outputs for a plurality (n) of channels.

An input digital signal of 10 bits is input in a divided state of 8 upper bits and 2 lower bits.

A resistor string 10 comprises 256 resistors which are connected in series, and has one terminal connected to a power supply and another terminal connected to ground. Therefore, 256 combinations of voltages of VH and VL can be obtained at 257 voltage output points of 0-256 which are at the terminals of the resistors of the resistor string 10. n selectors 12 ($12\text{-}1\sim 12\text{-}n$) are connected to the 257 voltage output points of the resistor string 10.

The resistor string 10 and the selector 12 form a part of an upper (bit) converter. 8 upper bits of the input digital signal is input to each selector 12, and the input signal determines from which two voltage output points voltages are to be output. Each selector 12 selects and outputs voltages of both ends of one resistor determined by the input digital signal. In other words, voltages obtained from the voltage output point determined by the 8 upper bits of the input digital signal and from the voltage output point which is immediately above the determined point are the selected voltages of both ends. Alternatively, as will be described later, it is also possible to output voltages on both ends of a serial connection of a predetermined plurality of resistors.

The pair of outputs VH and VL of each selector 12 are stabilized by buffer amplifiers 14H and 14L, and are supplied to two-bit D/A converters 16 ($16\text{-}1\sim 16\text{-}n$) which are lower (bit) converters. Two lower bits of the input digital signal are input to the two-bit D/A converter 16, and the two-bit D/A converter 16 generates four voltages based on the input voltages VH and VL, and selects and outputs one of the generated voltages based on the input signal of the two lower bits. For this purpose, the D/A converter 16 comprises four resistors and selects one of four voltages including one of VH or VL. Although in the present embodiment, VL is selected, it is also possible to select VH.

Figure 2:
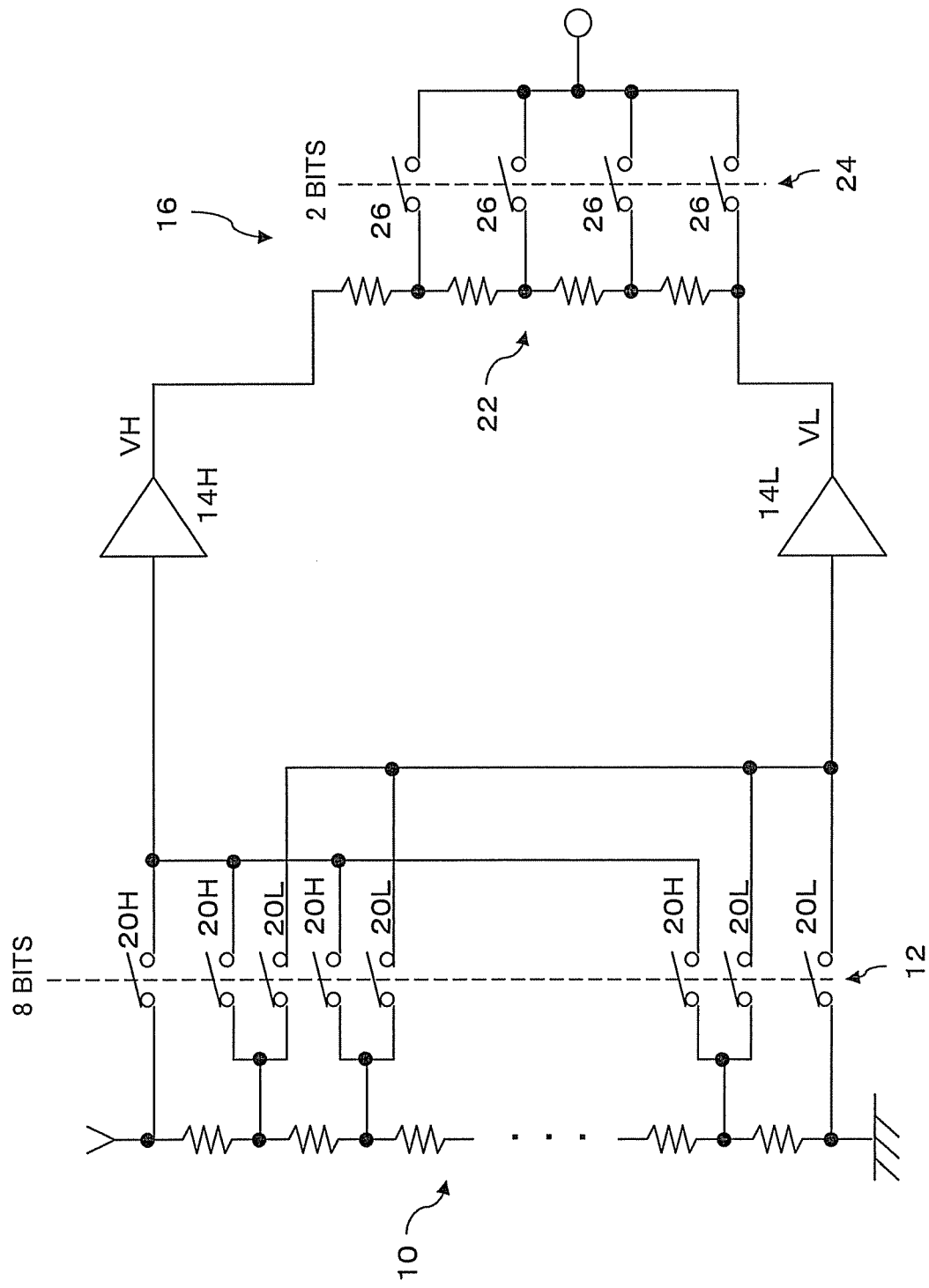
FIG. 2 is a diagram showing a detailed structure of a preferred embodiment of the present invention.

FIG. 2 shows structures of the selector 12 and the two-bit D/A converter 16. At the voltage output points of both ends of each resistor of the resistor string 10, two switches 20H for H and 20L for L are connected. At the upper side of the uppermost resistor of the resistor string 10, only the switch 20H for H is connected, and, at the lower side of the lowermost resistor, only the switch 20L for L is connected. Depending on the input data of the 8 upper bits, one of the L switches 20L and the H switch 20H immediately above the L switch 20L are selected, and VL and VH which are outputs indicating a range indicated by the upper bits are output for the data of the 8 upper bits.

The two-bit D/A converter 16 comprises a resistor string 22 having four resisters which are connected in series and a selector 24. VL and each connection point between the four resistors are connected to a switch 26 of the selector 24 and are connected to an output terminal through four switches 26. The switches 26 are switched ON and OFF by the two lower bits. Specifically, one of the switches 26 is selected and switched ON by 0-3 of the data of the two lower bits, and a voltage corresponding to the lower two bits is output.

As described, voltages VH and VL corresponding to the 8 upper bits are supplied to the two-bit D/A converter 16, and a voltage between the voltages VH and VL identified by the lower two bits is output. Therefore, an analog voltage corresponding to data of 10 bits is output as a whole, and, thus, D/A conversion of 10 bits is executed.

As described, in the present embodiment, D/A conversion of 10 bits can be executed using the resistor string 10 of 8 bits and the resistor string 22 of 2 bits, and, thus, D/A conversion for digital data of 10 bits can be enabled with a total of 260 (256+4) resistors. By reducing the number of resistors used in the resistor string, it is possible to reduce a width of the D/A converter.

[Another Structure of D/A Converter]

Figure 3:
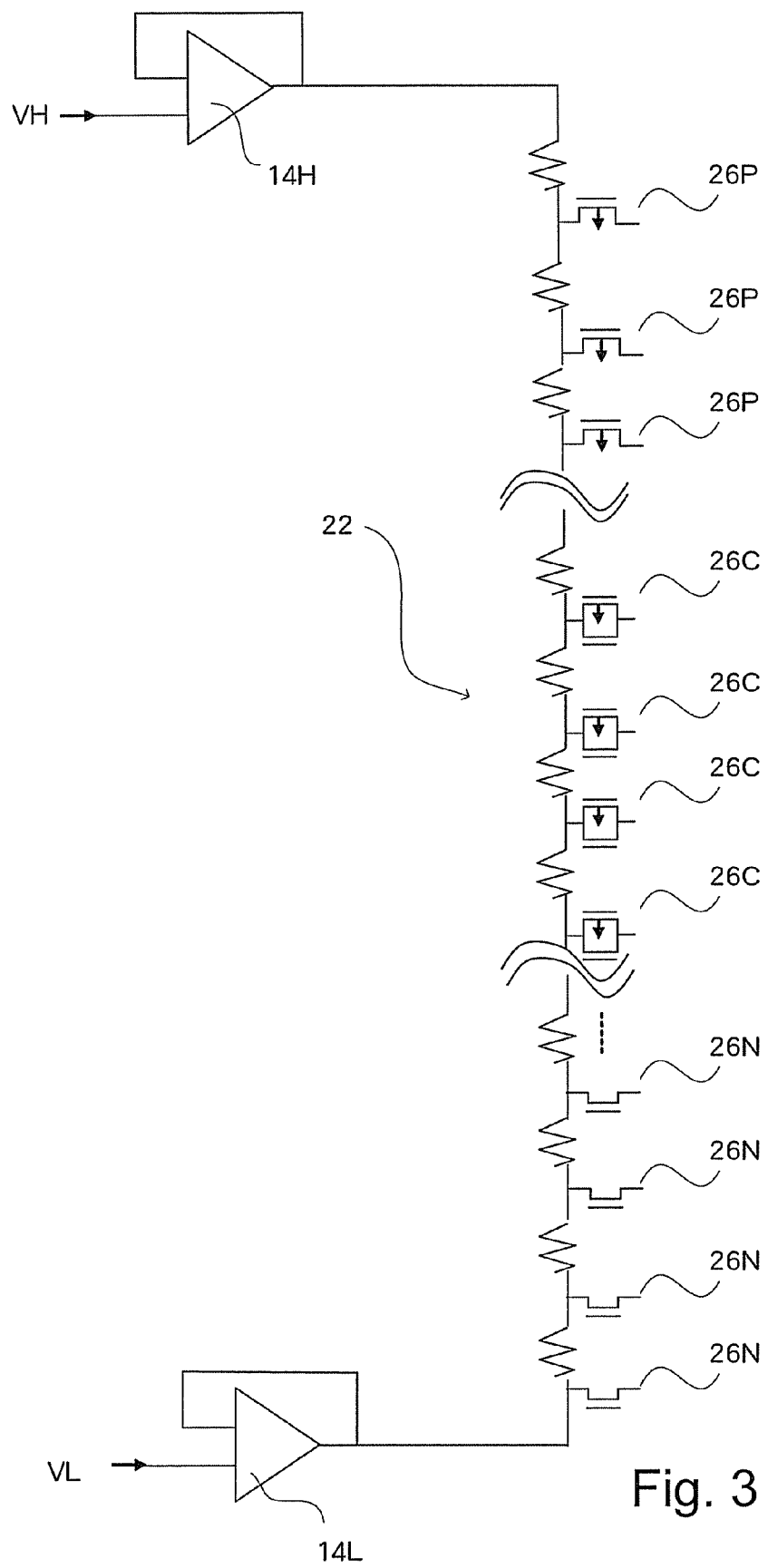
FIG. 3 is a diagram showing a structure of another preferred embodiment of the present invention.

FIG. 3 shows another example structure of the D/A converter. In this example configuration, voltages that are distanced by 8 output points from a reference point are selected in the selector 12 of the resistor string 10 shown in FIG. 2. Specifically, a switch at an output point which is 8 output points above the voltage output point determined by the 8 upper bits and a switch at an output point which is 8 output points below the voltage output point determined by the 8 upper bits are selected, and the selected voltages are set as voltages VH and VL.

A two-bit D/A converter 16 comprises a resistor string 22 having 64 resistors. At the resistor string 22, NMOS switches 26N are connected to lower connection points of 32 lower resistors and PMOS switches 26P are connected to lower connection points of 28 upper resistors. In addition, CMOS (Complementary MOS) switches 26C are connected to lower connection points of 4 intermediate resistors.

When the input digital data of 10 bits is in a range of 0~31, it is not possible to select, as the L switch 20L in the resistor string 10, a switch 20L which is 8 output points lower than the corresponding output point. Thus, for such data, the L switch 20L and the H switch 20H identical to the case where the input digital data of 10 bits is 32 are selected, and one of the 32 lower NMOS switches 26N is selected corresponding to the data. When the input digital data of 10 bits is in a range of 992~1023, switches 20L and 20H identical to the case where the input digital data of 10 bits is 991 are selected, and one of the 4 CMOS switches 26C and the 28 upper PMOS switches 26P is selected corresponding to the data.

When, on the other hand, the input digital data of 10 bits is in a range of 32~991, one of the 4 CMOS switches 26C is selected similar to a normal case. In other words, in a normal case, one of the CMOS switches 26C is selected by the two lower bits of the input data, D/A conversion for the two lower bits is executed, and a D/A conversion output for the digital data of 10 bits is obtained at the output.

In this manner, by selecting switches that are distanced by a predetermined number in place of controlling adjacent switches 20H and 20L and expanding a range of the VH-VL of the output of the resistor string 10, it is possible to reduce the error in the outputs VH and VL to a relatively lower value, and a highly precise D/A conversion can be executed. By using the 4 center resistors in the normal case in the resistor string 22 and employing CMOS switches 26C in these switches, it is possible to highly precisely output the voltage.

A D/A conversion precision of the 28 upper outputs and the 32 lower outputs is inferior compared to a D/A conversion precision of the 4 center outputs. In consideration of this, in the example structure, the upper and lower outputs are assigned to a range which is outside a normal operation guarantee range of the 10-bits D/A conversion. Alternatively, it is also possible to employ the CMOS switch for the 28 upper outputs and the 32 lower outputs.

In the above-described configuration, a configuration is employed in which 28 resistors are added on the upper side and 32 resistors are added on the lower side. The present invention, however, is not limited to such a configuration, and, alternatively, a configuration with, for example, 16 resistors, 8 resistors, and 4 resistors may be employed.

[Structure Which Uses Correction Data]

Figure 4:
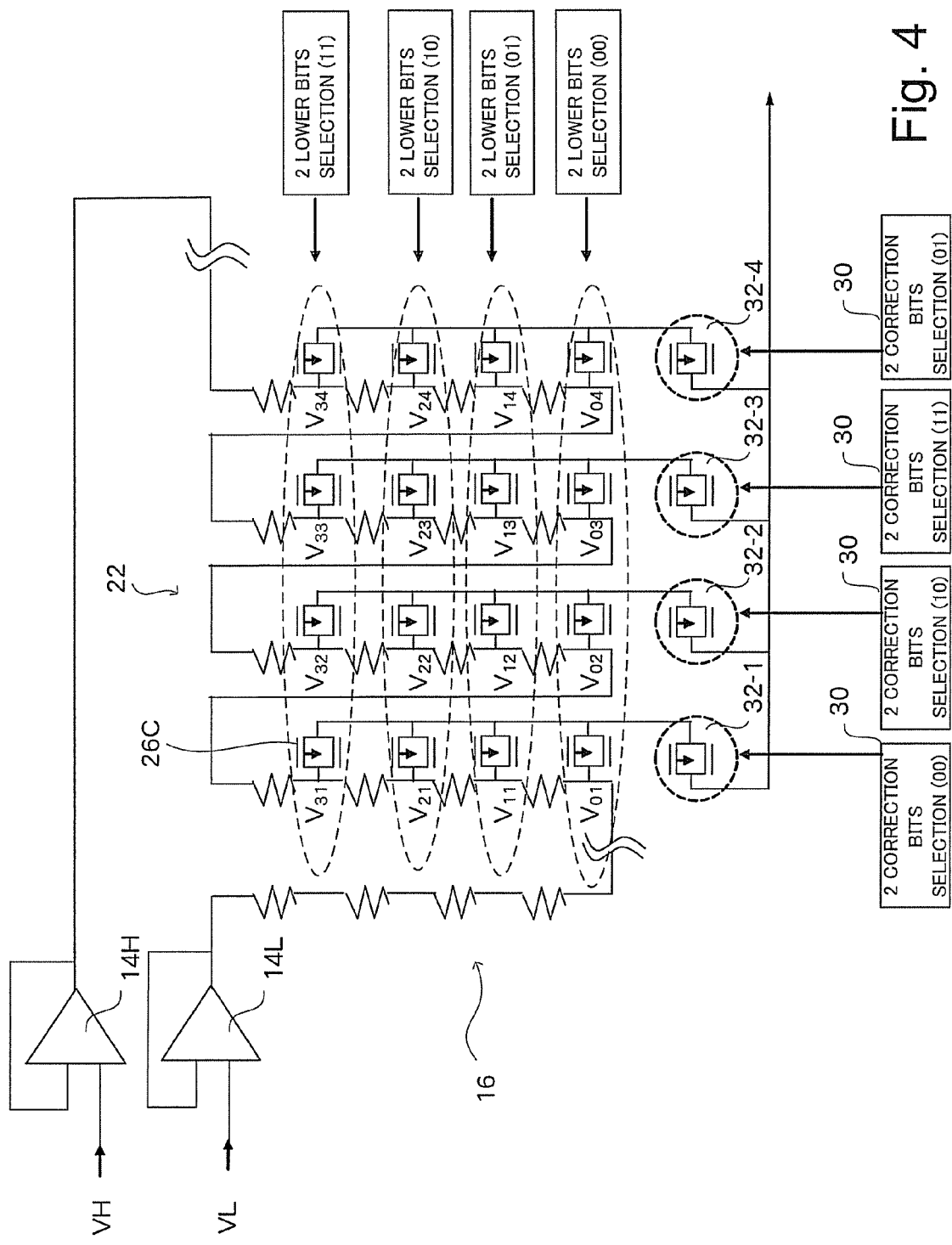
FIG. 4 is a diagram showing a structure of a correction by correction data.

FIG. 4 shows a structure of a D/A converter which uses the correction data of the embodiments. In the exemplified configuration, four correction registers 30 are provided. The correction data which is set by the fuse as described above is loaded to the correction register 30.

A resistor string 22 comprises 16 switches 26C which are selected by two lower bits of the input data. More specifically, while in the configuration shown in FIG. 3 and described above, one of the four CMOS switches 26C connected to the four resistors is selected by the two lower bits of the input data when the digital data of 10 bits is in the range of 32~995, in the present embodiment, CMOS switches are employed in a part of the PMOS switches 26P and the NMOS switches 26N at the center portion.

For example, in the resistor string 22, NMOS switches 26N are connected to lower connection points of 24 lower resistors and PMOS switches 26P are connected to lower connection points of 24 upper resistors. CMOS switches 26C are connected to lower connection points of 16 intermediate resistors.

In the present embodiment, one of groups of four CMOS switches 26C among the 16 CMOS switches is selected by the two lower bits of the input data. That is, when the lower bits of the input data are "00", $V_{01}$, $V_{02}$, $V_{03}$, and $V_{04}$ are selected as output voltages; when the lower bits of the input data are "01", $V_{11}$, $V_{12}$, $V_{13}$, and $V_{14}$ are selected as output voltages; when the lower bits of the input data are "10", $V_{21}$, $V_{22}$, $V_{23}$, and $V_{24}$ are selected as output voltages; and when the lower bits of the input data are "11", $V_{31}$, $V_{32}$, $V_{33}$, and $V_{34}$ are selected as output voltages. In addition, one of correction switches 32-1, 32-2, 32-3, and 32-4 is selected by the correction register 30. With this configuration, one of the four output voltages selected by the two lower bits of the input data is selected by the correction switch and is output. More specifically, for example, when the two lower bits of the input data are "00" and the correction switch 32-1 is selected, $V_{01}$ is output.

As described, in this example configuration, four switches 26C which are connected to every four resistors of the 16 resistors which are connected in series are selected by the two lower bits of the input data, and one of the outputs of the four switches 26C is selected by the correction switch 32 which is controlled by the correction data. Therefore, with correction data of two bits, an output for an LSB (Least Significant Bit) of the input data can be shifted by an amount corresponding to two lower bits.

In the present embodiment, the data to be output is corrected by shifting the data of the two lower bits by 4 bits, a similar correction can be realized by shifting the data of the 8 upper bits by 1 bit. In this case, the CMOS switches 26 may be connected only to the four center resistors among the 64 resistors of the two-bit D/A converter 16.

What is claimed is:

1. A fuse reading circuit comprising:
a plurality of fuse circuits in which information is rewritten
a selector circuit which is connected to the plurality of fuse circuits;
a reading circuit which is connected to the selector circuit and which reads information of the plurality of fuse circuits; and
a plurality of storage circuits which store information read by the reading circuit;
wherein the selector circuit sequentially selects the plurality of fuse circuits and the reading circuit reads the information of the plurality of fuse circuits;
the selector circuit sequentially selects one of the plurality of fuse circuits; and
information sequentially read by the reading circuit is output from the plurality of storage circuits in parallel.

2. A fuse reading circuit comprising:
a plurality of fuse circuits in which information is rewritten;
a selector circuit which is connected to the plurality of fuse circuits;
a reading circuit which is connected to the selector circuit and which reads information of the plurality of fuse circuits; and
a plurality of storage circuits which store information read by the reading circuit;

wherein the selector circuit sequentially selects the plurality of fuse circuits and the reading circuit reads the information of the plurality of fuse circuits;

information sequentially read by the reading circuit is output from the plurality of storage circuits in parallel.

3. A fuse reading circuit comprising:

a plurality of fuse circuits in which information is rewritten;

a selector circuit which is connected to the plurality of fuse circuits; and a reading circuit which is connected to the selector circuit and which reads information of the plurality of fuse circuits, wherein the selector circuit sequentially selects the plurality of fuse circuits and the reading circuit reads the information of the plurality of fuse circuits;

the plurality of fuse circuits include a plurality of data bits and a polarity bit; and the fuse reading circuit further comprises a polarity inversion circuit which inverts outputs of the storage circuits which store the plurality of data bits according to a value of the polarity bit.

* * * * *